United States Patent
Wang et al.

(10) Patent No.: US 9,076,555 B2
(45) Date of Patent: Jul. 7, 2015

(54) FAILURE DIAGNOSIS CIRCUIT

(75) Inventors: HongWei Wang, Shenzhen (CN); Luca Molinari, Piacenza (IT)

(73) Assignees: STMicroelectronics S.r.l., Agrate Brianza (MB) (IT); STMicroelectronics (Shenzhen) R&D Co. Ltd, Shenzhen (CN)

( * ) Notice: Subject to any disclaimer, the term of this patent is extended or adjusted under 35 U.S.C. 154(b) by 214 days.

(21) Appl. No.: 13/597,373

(22) Filed: Aug. 29, 2012

(65) Prior Publication Data

US 2013/0077421 A1    Mar. 28, 2013

(30) Foreign Application Priority Data

Sep. 27, 2011   (CN) .............................. 2011 0 304946

(51) Int. Cl.
*G11C 29/00* (2006.01)
*G11C 29/26* (2006.01)
*G11C 29/44* (2006.01)
*G11C 5/04* (2006.01)

(52) U.S. Cl.
CPC ....... *G11C 29/26* (2013.01); *G11C 5/04* (2013.01); *G11C 29/44* (2013.01)

(58) Field of Classification Search
CPC ......... G11C 29/02; G11C 29/44; G11C 29/12
USPC ............... 365/201, 189.02, 200, 230.02
See application file for complete search history.

(56) References Cited

U.S. PATENT DOCUMENTS

| 7,284,070 B2* | 10/2007 | Boucher et al. ............... 709/250 |
| 7,518,918 B2* | 4/2009 | Gorman ................... 365/185.09 |
| 8,539,153 B2* | 9/2013 | Cho et al. ..................... 711/118 |

FOREIGN PATENT DOCUMENTS

CN    1828553 A    9/2006

OTHER PUBLICATIONS

First Office Action for CN Appl. No. 201110306946.3 dated Nov. 25, 2014 (9 pages).

* cited by examiner

*Primary Examiner* — Tuan T Nguyen
(74) *Attorney, Agent, or Firm* — Gardere Wynne Sewell LLP

(57) ABSTRACT

A failure diagnosis circuit includes a multiplexer and a controller. The multiplexer receives address signals, and selectively outputs one of the address signals to an addressable module in response to a selecting signal. The controller generates a first one of address signals and the selecting signal. A built-in self-test circuit generates the second address signal. The addressable module includes addressable components responsive to the address signal. The controller processes the output of the addressable module responsive to the address signal to make a failure diagnosis. The built-in self-test circuit performs signature analysis on the read out output of the addressable module.

18 Claims, 3 Drawing Sheets

FAILURE DIAGNOSIS CIRCUIT

PRIORITY CLAIM

This application claims priority from Chinese Application for Pat. No. 20110304946.3 filed Sep. 27, 2011, the disclosure of which is hereby incorporated by reference.

TECHNICAL FIELD

This invention relates generally to electronic circuits, and more particularly to a circuit for implementing failure diagnosis for integrated circuits.

BACKGROUND

In recent years, various kinds of integrated circuit chips have been developed in which a memory is incorporated in a logic section such as ASIC or microprocessor. As the integrated circuit chips become more and more complex, test apparatus for properly and extensively testing the chips accordingly increases in number and complexity. In order to reduce the complexity and reliance upon external test apparatus, on-chip test circuits are provided in the integrated circuits for autonomously conducting at least part of the test. The circuit is commonly referred to as built-in self test (BIST) circuit.

The BIST circuit is a technique of designing additional hardware and software features into the integrated circuits to allow them to perform self-testing using their own circuits. Thhe BIST circuit used in memory devices such as EPROMs, EEPROMs, SRAMs, DRAMs, flash memories, or microprocessors or microcontrollers with embedded RAMs and ROMs, typically consists of test circuits that apply, read, and compare test patterns designed to expose potential physical failures in the memory device. Specifically, the BIST circuit may generate a characteristic signature related with data stored in the memory according to certain algorithm, for example, a cyclic redundancy check (CRC) algorithm. Further, the BIST circuit may compare the characteristic signature with a test signature obtained during the BIST test process. If a difference between the characteristic signature and the test signature occurs, the memory device is considered as a failure device.

However, the BIST test process is generally transparent to test engineers. Only a few test information can be provided by the BIST circuit, and therefore it is difficult for test engineers or fabrication engineers to analyze the root cause for the physical failures.

Thus, there is a need for a failure diagnosis circuit for integrated circuits with more flexibility and low cost.

SUMMARY

In one aspect, there is provided a circuit. The circuit comprises a multiplexer and a controller. The multiplexer is configured to receive a plurality of address signals, and to selectively output one of the plurality of address signals to an addressable module in response to a selecting signal. The controller is configured to generate a first address signal of the plurality of address signals and the selecting signal, and to read out an output of the addressable module 107 in response to the first address signal.

In another aspect, there is provided an integrated circuit. The integrated circuit comprises an addressable module and a multiplexer. The addressable module has a set of addressable components. The multiplexer is configured to receive a plurality of address signals, and to selectively output one of the plurality of address signals to an addressable module in response to a selecting signal.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
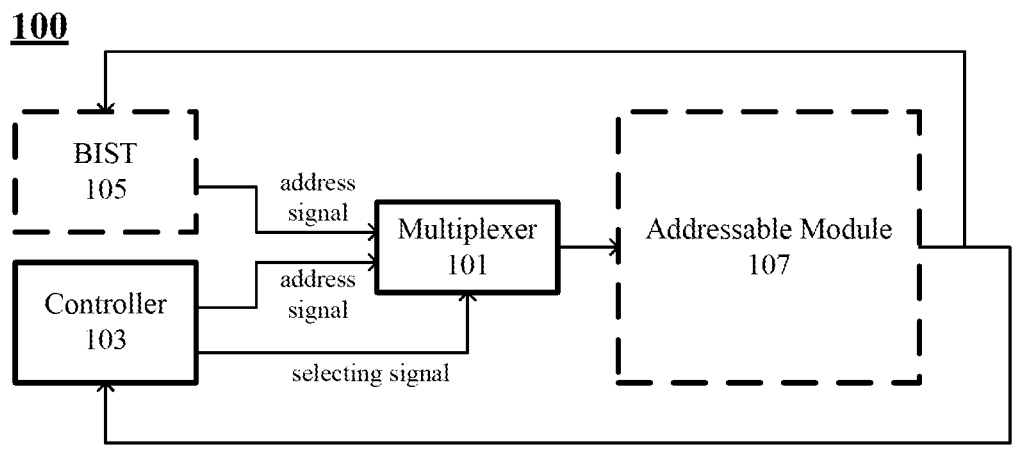
FIG. 1 shows a block diagram of an embodiment of a circuit.

FIG. 1 shows a block diagram of an embodiment of a circuit 100. The circuit 100 is used to diagnose failures of an addressable module 107, which has a set of addressable components. For example, the addressable module 107 is a memory device having a plurality of memory cells, such as ROMs, RAMs, flash memories, anti-fuse programmable logic arrays, or embedded memories. The plurality of memory cells are typically arranged in an array, such that the memory device includes several individually addressable rows and columns to which data can be written and from which data can be read. It is appreciated that the memory device also includes control logic for receiving address signals corresponding to locations of the memory cells, such that the control logic determines which of the plurality of memory cells are written into or read from at any given time. Those of ordinary skills in the art will understand that the circuit 100 can be used for other devices whose locations can be visited by sharing interfaces or control logics.

As shown in FIG. 1, the circuit 100 comprises a multiplexer 101 and a controller 103.

The multiplexer 101 is configured to receive a plurality of address signals, and to selectively output one of the plurality of address signals to the addressable module 107 in response to a selecting signal.

The controller 103 is configured to generate a first address signal of the plurality of address signals and the selecting signal, and to read out an output of the addressable module 107 in response to the first address signal.

The multiplexer 101 has a plurality of channels for receiving the plurality of address signals. In one embodiment, the multiplexer 101 has two channels, one of which is configured to receive the first address signal generated by the controller 103, and the other of which is configured to receive a second address signal of the plurality of address signals that is provided by a BIST module 105. Specifically, the multiplexer 101 outputs the first address signal when receiving the selecting signal being in a first state, and outputs the second address signal when receiving the selecting signal being in a second state that is different from the first state.

The address signals are used for selecting one or more components of the set of addressable components within the addressable module 107. Upon receiving one address signal of a specific address value, the addressable module 107 will locate the addressable component(s) that is associated with the specific address value. As mentioned above, the addressable module 107 generally includes several addressable rows and columns, so the multiplexer 101 may have multiple bits per channel for the address signals. For example, if each of the address signals has 16 bits, the multiplexer 101 may have 16 bits for each channel accordingly.

To communicatively interact with the addressable module 107, the circuit 100 further comprises a communication interface (not shown), which is configured to communicatively couple the controller 103 to the addressable module 107 and the multiplexer 101. For example, the communication interface comprises an I$^2$C interface, Universal Serial Bus (USB) interface, Peripheral Component Interconnect (PCI) interface or other interfaces. Preferably, the communication interface is an I$^2$C interface, which needs fewer pins and control logic for communication.

In an embodiment, the first address signal generated by the controller 103 is a programmable address signal, that is, the first address signal comprises a programmable sequence of address values, both of the address values and a sequence of the address values can be adjusted. Preferably, the controller 103 further comprises a first register set for storing a set of address values, and therefore the controller 103 can generate the first address signal according to the set of address values. In practical applications, the address values stored in the first register set can be modified by programming or debugging tools. As a result, the first address signal is adjustable so that each of the addressable components within the addressable module 107 can be selected for further read or write operation. In this way, the controller 103 can read out any of the addressable components by programming the first address signal. Then, potential failures of the addressable components are easy and flexible to find out.

The BIST module 105 is configured to provide the second address signal and to read out the addressable module 107 in response to the second address signal. In an embodiment, the BIST module 105 generates the second address signal according to certain algorithm that is embedded in the BIST module 105. Specifically, the BIST module 105 may automatically generate the second address signal upon receiving an activation signal from an automatic test equipment (ATE). The second address signal may include a series of address values corresponding to at least part of the addressable components. Preferably, the BIST module 105 is further configured to perform a signature analysis on the addressable module 107 based on the readout data from the addressable module 107. For example, the BIST module 105 generates a characteristic signature related with data stored in the addressable module 107 according to certain algorithm, for example, a CRC algorithm. Then, the BIST module 105 compares the readout data with the characteristic signature to determine if there is any defect or failure in the addressable module 107. It will be readily understood by those skilled in the art that the BIST module 105 can be any BIST circuit that is capable of implementing self-testing with/without ATE for integrated circuit chips.

From the foregoing, the circuit 100 can perform automatic test as well as manual test for devices by multiplexing different address signals, which enables the invention to be compatible with conventional ATE apparatuses and test routines. Furthermore, as the circuit 100 can generate a programmable address signal to locate different components within a device under test, it is more flexible in applications and very helpful to find out potential failures within the device under test. Such test information associated with failures within the device can be used by test engineers or fabrication engineers to diagnose root causes for the failures so as to improve the product yield. For example, the engineers can use a scanning electron microscope (SEM) to have a further inspection on the device under test.

Figure 2:
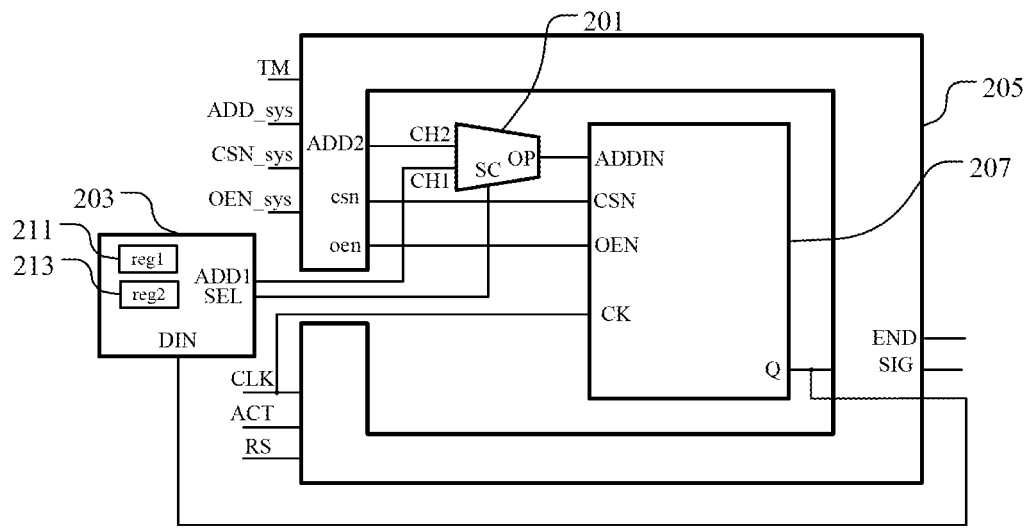
FIG. 2 shows an exemplary detailed schematic of the circuit of FIG. 1.

FIG. 2 shows an exemplary detailed schematic of the circuit 100 of FIG. 1.

As shown in FIG. 2, the circuit comprises a multiplexer 201, a controller 203 and optionally a BIST module 205. The circuit is configured to diagnose potential failures of an addressable module 207 having a set of addressable components.

The multiplexer 201 has a first input channel CH1, a second input channel CH2, a selecting control node SC and an output node OP. In detail, the first input channel CH1 is coupled to a first address output node ADD1 of the controller 203 for receiving a first address signal. The second input channel CH2 is coupled to a second address output node ADD2 of the BIST module 205 for receiving a second address signal. The selecting control node SC is coupled to a selecting output node SEL of the controller 203 for receiving a selecting signal. The output node OP is coupled to an address control node ADDIN of the addressable module 207. Then, the multiplexer 201 selectively outputs the first address signal or the second address signal to the addressable module 207 in response to the selecting signal.

The controller 203 has the first address output node ADD1, the selecting output node SEL and a data input node DIN. The data input node DIN is coupled to a data output node Q of the addressable module 207 for receiving readout data from the addressable module 207. In the embodiment, the controller 203 comprises a first register set 211 and a second register set 213. The first register set 211 is configured to store a set of address values corresponding to the addressable components within the addressable module 207, and therefore the controller 203 can generate the first address signal according to the set of address values. The second register set 213 is configured to receive and store the readout data of the addressable module 207, that is, the data stored in respective components of the addressable module 207.

In an embodiment, the controller 203 is further configured to compare the readout data of the addressable module 207 with a reference value and to output a warning signal in case that the readout data of the addressable module 207 is different from the reference value. The warning signal can be used to indicate a failure of the addressable module 207 under test.

Still referring to FIG. 2, the circuit comprises the BIST module 205 for implementing self-testing for the addressable module 207. The BIST module 205 is responsive to a test control signal which enables the BIST module 205 to operate in a test mode or in a normal mode. Specifically, when the BIST module 205 operates in the normal mode, the BIST module 205 will receive the second address signal at an address input node ADD_sys and operation control signals at nodes CSN_sys and OEN_sys. The second address signal will be further provided to the multiplexer 201, while the operation control signals will be further provided to the operation control nodes CSN and OEN of the addressable module 207. The operation control node CSN is configured to enable or disable the addressable module 207 to receive address signals, and the operation control node OEN is configured to enable or disable the addressable module 207 to output data at the data output node Q.

When the BIST module 205 operates in the test mode, the BIST module 205 automatically generates the second address signal that includes a series of address values corresponding to at least part of the addressable components within the addressable module 207 so as to implement the self-testing for the addressable module 207. Preferably, the second address signal includes address values that are corresponding to all the addressable components within the addressable module 207, and therefore all the addressable components can be tested. In practical applications, generating the second address signal is triggered by an activation signal, for example, a rising edge, at an activation node ACT of the BIST module 205. The activation signal may be provided by an ATE apparatus.

In an embodiment, the BIST module 205 is further configured to perform a signature analysis on the readout data of the addressable module 207 to check if there exists any defect or failure in the addressable module 207. The result of the signature analysis is outputted at the node SIG, and an end signal indicating the signature analysis is over is outputted at the node END. Preferably, the circuit can implement the self-testing on the addressable module 207 via the BIST module 205 first. If any failures are found in the addressable module 207 or the self-testing is interrupted, the circuit can further implement manual test via the controller 203.

Figure 3:
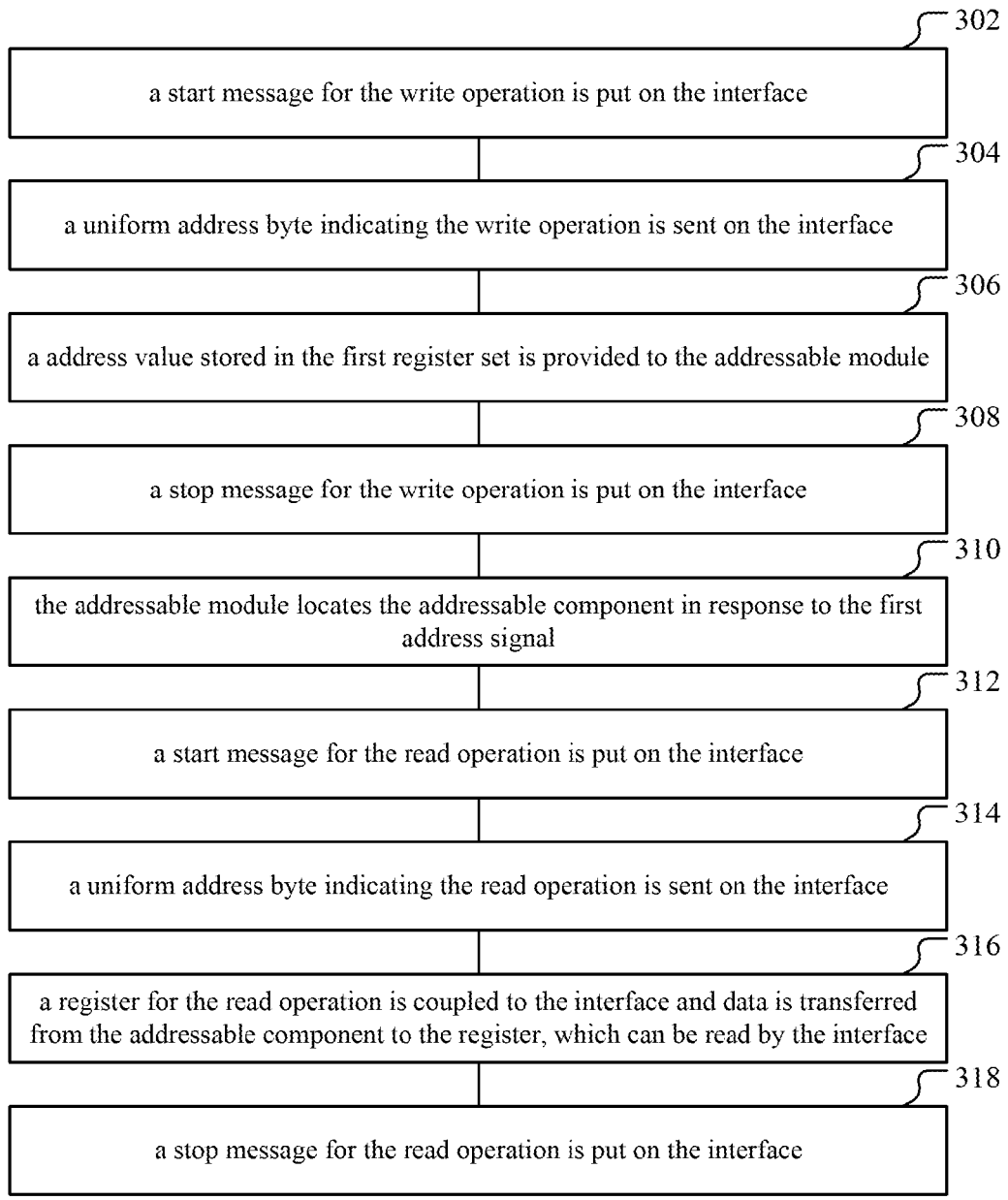
FIG. 3 shows an exemplary operation of the circuit in FIG. 2.

In the embodiment, the controller 203 is coupled to the multiplexer 201 and the addressable module 207 via an $I^2C$ interface. FIG. 3 shows an exemplary operation of the circuit using the $I^2C$ interface. Hereafter, the working of the circuit will be elaborated with reference to FIGS. 2 and 3. It will be readily understood by those skilled in the art that other communication interfaces can also be employed to access the addressable module 207 in a same or similar manner.

First, the controller 203 performs a write operation on the $I^2C$ interface to generate the first address signal. Specifically, in step 302, when there is no activity on the interface, a start message is put on the interface by a master module for the $I^2C$ interface, such that the $I^2C$ interface is mastered by the master module and all the other modules coupled to the interface, for example, the register sets coupled, can be called up or addressed accordingly. Afterwards, in step 304, a uniform address byte having 8 bits is sent on the interface immediately after the start message, wherein the lowest bit of the uniform address byte is configured to indicate the write operation. Then, in step 306, a register of the first register set 211 may be addressed for the write operation so that a address value stored in the register is provided to the addressable module 207 via the multiplexer 201 (assume that the first input channel CH1 is selected), which constitutes part of the first address signal. The write operation ends when the address value is completely sent out, and in step 308, a stop message is put on the interface by the master module so that the interface frees up.

In step 310, upon receiving the first address signal, the addressable module 207 locates the addressable component in response to the first address signal inputted (i.e. the address value), then the data of the addressable component located can be read out by the controller 203, which will be further stored in the second register set 213 of the controller 203. Specifically, the controller 203 performs a read operation on the $I^2C$ interface to receive the data of the addressable component. Similar to the write operation, in step 312, a start message is put on the interface by the master module for the $I^2C$ interface, such that the $I^2C$ interface is mastered by the master module and all the other modules coupled to the interface can be called up or addressed accordingly. Afterwards, in step 314, a uniform address byte having 8 bits is sent on the interface immediately after the start message, wherein the lowest bit of the uniform address byte is configured to indicate the read operation. Then, in step 316, a register of the second register set 213 may be addressed for the read operation so that the register is coupled to the $I^2C$ interface and the data stored in the addressable module 207 is transferred to the register coupled. Afterwards, the $I^2C$ interface reads the data from the register coupled. The read operation ends when the data is completely sent out, and in step 318, a stop message is put on the interface by the master module so that the interface frees up.

By repeating the write and read operations, the data stored in all the addressable components within the addressable module 207 can be read out and stored in the controller 203 one by one, which will be used to diagnose the status of the addressable module 207.

Figure 4:
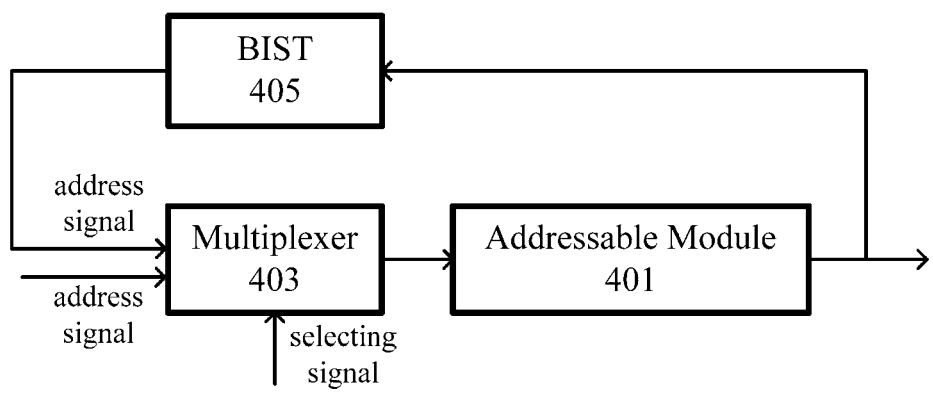
FIG. 4 shows a block diagram of an embodiment of an integrated circuit.

FIG. 4 shows a block diagram of an embodiment of an integrated circuit 400.

As shown in FIG. 4, the integrated circuit 400 comprises an addressable module 401 having a set of addressable components and a multiplexer 403.

In embodiments, the addressable module 401 may be a memory device having a plurality of memory cells, such as ROMs, RAMs, flash memories, anti-fuse programmable logic arrays, or embedded memories. The plurality of memory cells are typically arranged in an array, such that the memory device includes several individually addressable rows and columns to which data can be written and from which data can be read. It is appreciated that the memory device also includes a control logic for receiving address signals corresponding to locations of the memory cells, such that the control logic determines which of the plurality of memory cells are written into or read from at any given time. Those of ordinary skills in the art will understand that the addressable module 401 may be other devices whose locations can be visited by sharing interfaces or control logics.

The multiplexer 403 is configured to receive a plurality of address signals, and to selectively output one of the plurality of address signals to the addressable module 401 in response to a selecting signal.

In an embodiment, the multiplexer 403 has a plurality of channels for receiving the plurality of address signals. In one embodiment, the multiplexer 403 has two channels, one of which is configured to receive a first address signal that is programmable, and the other of which is configured to receive a second address signal that is provided by a BIST module 405.

The address signals are used for selecting one or more components of the set of addressable components within the addressable module 401. Upon receiving one address signal of a specific address value, the addressable module 401 will locate the addressable component(s) that is associated with the specific address value.

From the foregoing, the integrated circuit 400 has the multiplexer 403 for receiving or selecting different address signals, wherein one or more input channels of the multiplexer 403 may not be occupied by a BIST module 405. In this way, the addressable module 401 is provided the additional input channel(s) for receiving address signal(s) other than the second address signal generated by the BIST module 405, which enable manual diagnosis for specific components within the addressable module 401. The manual diagnosis advantageously helps to locate failures of the addressable module 401.

In an embodiment, the integrated circuit 400 further comprises the BIST module 405, which is configured to provide the second address signal and to read out the addressable module 401 in response to the second address signal. In an embodiment, the BIST module 405 generates the second address signal according to certain algorithm that is embedded in the BIST module 405. Specifically, the BIST module 405 may automatically generate the second address signal upon receiving an activation signal from an automatic test equipment (ATE). The second address signal may include a series of address values corresponding to at least part of the addressable components for failure diagnosis. Preferably, the BIST module 405 is further configured to perform a signature analysis on the addressable module 401 based on the readout data from the addressable module 401. For example, the BIST module 405 generates a characteristic signature related with data stored in the addressable module 401 according to certain algorithm, for example, a CRC algorithm. Then, the BIST module 405 compares the readout data with the characteristic signature to determine if there is any defect or failure in the addressable module 401. It will be readily understood by those skilled in the art that the BIST module 405 can be any BIST circuit that is capable of implementing self-testing with/without ATE for integrated circuit chips.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
 a multiplexer configured to receive a first sequence of failure testing address signals and a second sequence of failure testing address signals, and to selectively output one of the sequences of failure testing address signals in response to a selecting signal for application to an addressable module having a set of addressable components; and
 a controller configured to generate the first sequence of failure testing address signals and the selecting signal and to read out an output of the addressable module in response to the first sequence of failure testing address signals.

2. The circuit as claimed in claim 1, wherein the first sequence of failure testing address signals comprises a programmable sequence of address values.

3. The circuit as claimed in claim 1, wherein the controller comprises: a first register set configured to store a set of address values and provide the first sequence of failure testing address signals according to the set of address values.

4. The circuit as claimed in claim 3, wherein the controller comprises: a second register set configured to receive and store the output of the addressable module.

5. The circuit as claimed in claim 1, further comprising: a communication interface, configured to communicatively couple the controller to the addressable module and the multiplexer.

6. The circuit as claimed in claim 5, wherein the communication interface comprises one of an I$^2$C interface, a USB interface or a PCI interface.

7. The circuit as claimed in claim 1, wherein the controller is further configured to compare the output of the addressable module with a reference value and to output a warning signal in case that the output of the addressable module is different from the reference value.

8. The circuit as claimed in claim 1, further comprising: a built-in-self-test module configured to generate the second sequence of failure testing address signals and to read out the output of the addressable module in response to the second sequence of failure testing address signals.

9. The circuit as claimed in claim 8, wherein the built-in-self-test module is further configured to perform a signature analysis on the addressable module based on the output read out from the addressable module.

10. The circuit as claimed in claim 1, wherein the addressable module comprises ROMs, RAMs, or flash memories.

11. An integrated circuit, comprising:
 an addressable module having a set of addressable components;
 a multiplexer configured to receive a first sequence of addressable module failure testing address signals and a second sequence of addressable module failure testing address signals, and to selectively output one of the addressable module failure testing address signals in response to a selecting signal for application to test for failure of the addressable module.

12. The integrated circuit as claimed in claim 11, further comprising: a built-in-self-test module configured to generate the second sequence of addressable module failure testing a second address signal of the plurality of address signals, and to read out from the addressable module in response to the second sequence of addressable module failure testing address signals.

13. The integrated circuit as claimed in claim 12, wherein the built-in-self-test module is further configured to perform a signature analysis on the addressable module based on the read out from the addressable module.

14. The integrated circuit as claimed in claim 11, wherein the addressable module comprises one of a ROM, a RAM, or a flash memory.

15. A circuit, comprising:
 an addressable module;
 a built-in self-test circuit configured to supply a first sequence of address signals configured to test for failure of the addressable module, wherein the first sequence of address signals comprises an address value on the addressable module;
 a controller circuit configured to supply a select signal and a second sequence of address signals configured to test for failure of the addressable module, wherein the second sequence of address signals comprises an address value on the addressable module; and a multiplexer circuit configured to receive the first sequence of address signals, the second sequence of address signals and the select signal, the multiplexer circuit operable in response to a first state of the select signal to pass the first sequence of address signals to the addressable module, and further operable in response to a second state of the select signal to pass the second sequence of address signals to the addressable module.

16. The circuit of claim 15, wherein the addressable module responds to the address value of the first or second sequence of address signals to output read out data to the controller circuit.

17. The circuit of claim 16, wherein the controller circuit is further configured to compare the read out data from the addressable module with a reference value and generate a warning signal if the read out data does not match the reference value.

18. The circuit of claim 16, wherein the built-in-self-test module is further configured to perform a signature analysis in response to the read out data from the addressable module.

\* \* \* \* \*